United States Patent
Vahid Far et al.

(10) Patent No.: US 9,490,784 B2
(45) Date of Patent: Nov. 8, 2016

(54) APPARATUS AND METHOD FOR GENERATING QUADRUPLED REFERENCE CLOCK FROM SINGLE ENDED CRYSTAL OSCILLATOR

(71) Applicant: QUALCOMM Incorporated, San Diego, CA (US)

(72) Inventors: Mohammad Bagher Vahid Far, San Jose, CA (US); Alireza Khalili, Sunnyvale, CA (US); Yashar Rajavi, Mountain View, CA (US); Amirpouya Kavousian, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/640,672

(22) Filed: Mar. 6, 2015

(65) Prior Publication Data

US 2016/0164507 A1    Jun. 9, 2016

Related U.S. Application Data

(60) Provisional application No. 62/089,497, filed on Dec. 9, 2014.

(51) Int. Cl.
*H03B 19/14* (2006.01)
*H03K 5/156* (2006.01)
(Continued)

(52) U.S. Cl.
CPC .......... *H03K 5/00006* (2013.01); *H03B 19/10* (2013.01); *H03B 19/14* (2013.01); *H03K 5/1565* (2013.01)

(58) Field of Classification Search
CPC ................... H03B 19/06–19/10; H03B 19/14; H03K 3/012; H03K 3/013; H03K 3/017; H03K 5/00006; H03K 5/156; H03K 5/1565
See application file for complete search history.

(56) References Cited

U.S. PATENT DOCUMENTS 5,963,071 A * 10/1999 Dowlatabadi ...... H03K 5/00006
327/116
6,480,045 B2 * 11/2002 Albean .............. H03K 5/00006
327/116
6,967,508 B2 * 11/2005 Zhou ................. H03K 5/00006
327/116

(Continued)

FOREIGN PATENT DOCUMENTS

EP          1139201 A2    10/2001

OTHER PUBLICATIONS

International Search Report and Written Opinion—PCT/US2015/063815—ISA/EPO—Mar. 21, 2016.

*Primary Examiner* — Patrick O'Neill
(74) *Attorney, Agent, or Firm* — Arent Fox LLP

(57) ABSTRACT

A method, an apparatus, and a computer program product are provided. The apparatus outputs a sinusoidal signal according to a first clock frequency, generates, a first digital signal having a 25% duty cycle based on the sinusoidal signal, generates a second digital signal having a 25% duty cycle based on the sinusoidal signal, combines the first digital signal and the second digital signal to generate a combined digital signal having a 50% duty cycle and a second clock frequency that is double the first clock frequency, and doubles the second clock frequency of the combined digital signal to generate an output signal having a third clock frequency that is quadruple the first clock frequency. The apparatus further generates a first control voltage and a second control voltage for the first buffer and a third control voltage for the second buffer based on the output signal.

30 Claims, 7 Drawing Sheets

(51) Int. Cl.
*H03K 5/00* (2006.01)
*H03B 19/10* (2006.01)

(56) References Cited

U.S. PATENT DOCUMENTS

| | | | |
|---|---|---|---|
| 6,977,536 B2* | 12/2005 | Chin-Chieh | H03K 5/1565 327/116 |
| 7,180,340 B2* | 2/2007 | Jung | G06F 7/68 327/116 |
| 7,898,309 B1 | 3/2011 | Dogan | |
| 8,269,530 B2* | 9/2012 | Tao | H03K 5/00006 327/116 |
| 8,487,680 B1 | 7/2013 | Chung et al. | |
| 8,629,708 B2 | 1/2014 | Ben-Yishay et al. | |
| 8,713,344 B2 | 4/2014 | Oh | |
| 8,736,329 B1 | 5/2014 | Rajavi et al. | |
| 8,988,121 B2* | 3/2015 | Terrovitis | H03L 7/08 327/156 |
| 2005/0194999 A1* | 9/2005 | Zhou | H03K 5/00006 327/116 |
| 2009/0015300 A1 | 1/2009 | Farnsworth | |
| 2013/0257499 A1 | 10/2013 | Wang et al. | |
| 2014/0225645 A1 | 8/2014 | Sharma et al. | |
| 2016/0028384 A1* | 1/2016 | Nomura | H03K 5/00006 327/116 |
| 2016/0099729 A1* | 4/2016 | Rajavi | H04B 1/04 375/297 |

* cited by examiner

APPARATUS AND METHOD FOR GENERATING QUADRUPLED REFERENCE CLOCK FROM SINGLE ENDED CRYSTAL OSCILLATOR

CROSS-REFERENCE TO RELATED APPLICATION(S)

This application claims the benefit of U.S. Provisional Application Ser. No. 62/089,497, entitled "APPARATUS AND METHOD FOR GENERATING QUADRUPLED REFERENCE CLOCK FROM SINGLE-ENDED CRYSTAL OSCILLATOR" and filed on Dec. 9, 2014, which is expressly incorporated by reference herein in its entirety.

BACKGROUND

1. Field

The present disclosure relates generally to communication systems, and more particularly, to an apparatus and method for quadrupling a clock frequency.

2. Background

A wireless device (e.g., a cellular phone or a smartphone) may transmit and receive data for two-way communication with a wireless communication system. The wireless device may include a transmitter for data transmission and a receiver for data reception. For data transmission, the transmitter may modulate a transmit local oscillator (LO) signal with data to obtain a modulated radio frequency (RF) signal, amplify the modulated RF signal to obtain an output RF signal having the desired output power level, and transmit the output RF signal via an antenna to a base station. For data reception, the receiver may obtain a received RF signal via the antenna, downconvert the received RF signal with a receive LO signal, and process the downconverted signal to recover data sent by the base station.

The wireless device may include one or more oscillators to generate one or more oscillator signals at one or more desired frequencies. The oscillator signal(s) may be used to generate the transmit LO signal for the transmitter and the receive LO signal for the receiver. The oscillator(s) may be required to generate the oscillator signal(s) to meet the requirements of the wireless communication system with which the wireless device communicates.

Clock generators may receive oscillator signals from an oscillator and may generate clock signals for various modules within the wireless device. A way to improve phase noise (PN) performance of particular device modules is to increase a frequency of a reference clock signal from a clock generator. However, previous attempts to increase the reference clock signal frequency have come at the cost of large power consumption, large device area use, and mediocre PN performance. Accordingly, an apparatus and method is needed for increasing the reference clock signal frequency to improve PN performance without suffering large power consumption or device area use.

SUMMARY

In an aspect of the disclosure, a method and an apparatus are provided. The apparatus is configured to output, via a voltage-controlled oscillator (VCO), a sinusoidal signal according to a first clock frequency, generating, via a first buffer, a first digital signal having a 25% duty cycle based on the sinusoidal signal, generate, via a second buffer, a second digital signal having a 25% duty cycle based on the sinusoidal signal, combine, via a combining module, the first digital signal and the second digital signal to generate a combined digital signal having a 50% duty cycle, the combined digital signal having a second clock frequency that is double the first clock frequency, and double, via a frequency doubling module, the second clock frequency of the combined digital signal to generate an output signal having a third clock frequency that is quadruple the first clock frequency.

The apparatus is further configured to generate, via a feedback module, a first control voltage and a second control voltage for the first buffer and a third control voltage for the second buffer based on the output signal, wherein the first control voltage controls a first threshold of the first buffer facilitating the first buffer to control a rising edge of the first digital signal, wherein the second control voltage controls a second threshold of the first buffer facilitating the first buffer to control a falling edge of the first digital signal, and wherein the third control voltage controls a threshold of the second buffer facilitating the second buffer to control a rising edge of the second digital signal.

The apparatus is also configured to control, via a delay module, an active state of a first section and a second section of the first buffer, by receiving the first digital signal outputted from the first buffer, determining a first delay based on the received first digital signal, activating the first section by sending a first enabling control signal to the gate of the fourth transistor based on the first delay, determining a second delay based on the received first digital signal, and activating the second section by sending a second enabling control signal to the gate of the seventh transistor based on the second delay.

DETAILED DESCRIPTION

Figure 1:
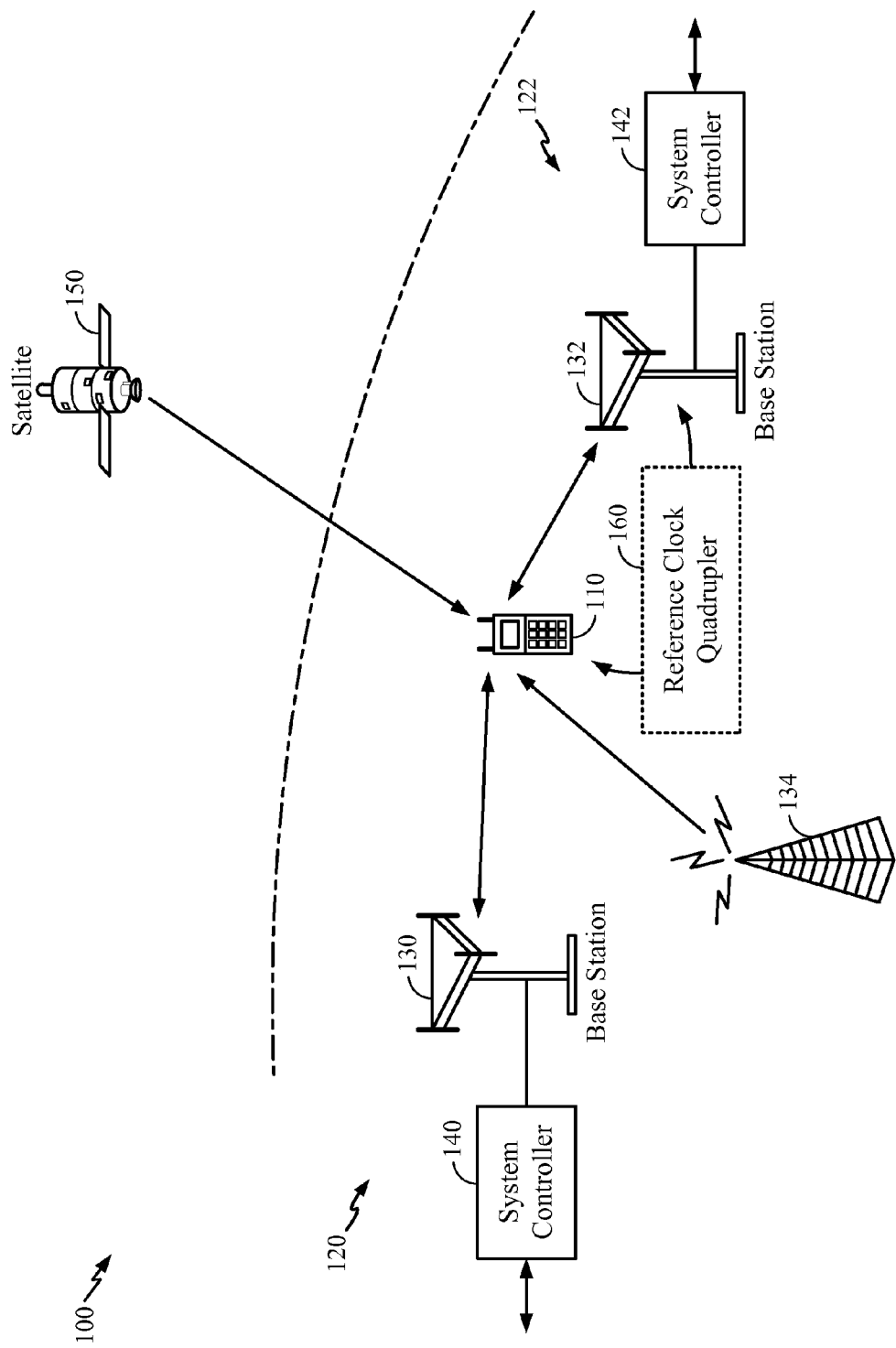
FIG. 1 illustrates a wireless device communicating with different wireless communication systems.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. The term "exemplary" is used herein to mean "serving as an example, instance, or illustration." Any design described herein as "exemplary" is not necessarily to be construed as preferred or advantageous over other designs.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise random-access memory (RAM), read-only memory (ROM), electronically erasable programmable ROM (EEPROM), compact disk (CD) ROM (CD-ROM), or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram 100 illustrating a wireless device 110 communicating with different wireless communication systems 120, 122. The wireless systems 120, 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), CDMA 1× or cdma2000, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, the wireless system 120 may be a GSM system, and the wireless system 122 may be a WCDMA system. As another example, the wireless system 120 may be an LTE system, and the wireless system 122 may be a CDMA system.

For simplicity, the diagram 100 shows the wireless system 120 including one base station 130 and one system controller 140, and the wireless system 122 including one base station 132 and one system controller 142. In general, each wireless system may include any number of base stations and any set of network entities. Each base station may support communication for wireless devices within the coverage of the base station. The base stations may also be referred to as a Node B, an evolved Node B (eNB), an access point, a base transceiver station, a radio base station, a radio transceiver, a transceiver function, a basic service set (BSS), an extended service set (ESS), or some other suitable terminology. The wireless device 110 may also be referred to as a user equipment (UE), a mobile device, a remote device, a wireless device, a wireless communications device, a station, a mobile station, a subscriber station, a mobile subscriber station, a terminal, a mobile terminal, a remote terminal, a wireless terminal, an access terminal, a client, a mobile client, a mobile unit, a subscriber unit, a wireless unit, a remote unit, a handset, a user agent, or some other suitable terminology. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, or some other similar functioning device.

The wireless device 110 may be capable of communicating with the wireless system 120 and/or 122. The wireless device 110 may also be capable of receiving signals from broadcast stations, such as the broadcast station 134. The wireless device 110 may also be capable of receiving signals from satellites, such as the satellite 150, in one or more global navigation satellite systems (GNSS). The wireless device 110 may support one or more radio technologies for wireless communication such as GSM, WCDMA, cdma2000, LTE, 802.11, etc. The terms "radio technology," "radio access technology," "air interface," and "standard" may be used interchangeably.

The wireless device 110 may communicate with a base station in a wireless system via the downlink and the uplink. The downlink (or forward link) refers to the communication link from the base station to the wireless device, and the uplink (or reverse link) refers to the communication link from the wireless device to the base station. A wireless system may utilize TDD and/or FDD. For TDD, the downlink and the uplink share the same frequency, and downlink transmissions and uplink transmissions may be sent on the same frequency in different time periods.

For FDD, the downlink and the uplink are allocated separate frequencies. Downlink transmissions may be sent on one frequency, and uplink transmissions may be sent on another frequency. Some exemplary radio technologies supporting TDD include GSM, LTE, and TD-SCDMA. Some exemplary radio technologies supporting FDD include WCDMA, cdma2000, and LTE. The wireless device 110 and/or the base stations 130, 132 may include an exemplary reference clock quadrupler 160. An exemplary reference clock quadrupler 160 is provided infra.

Figure 2:
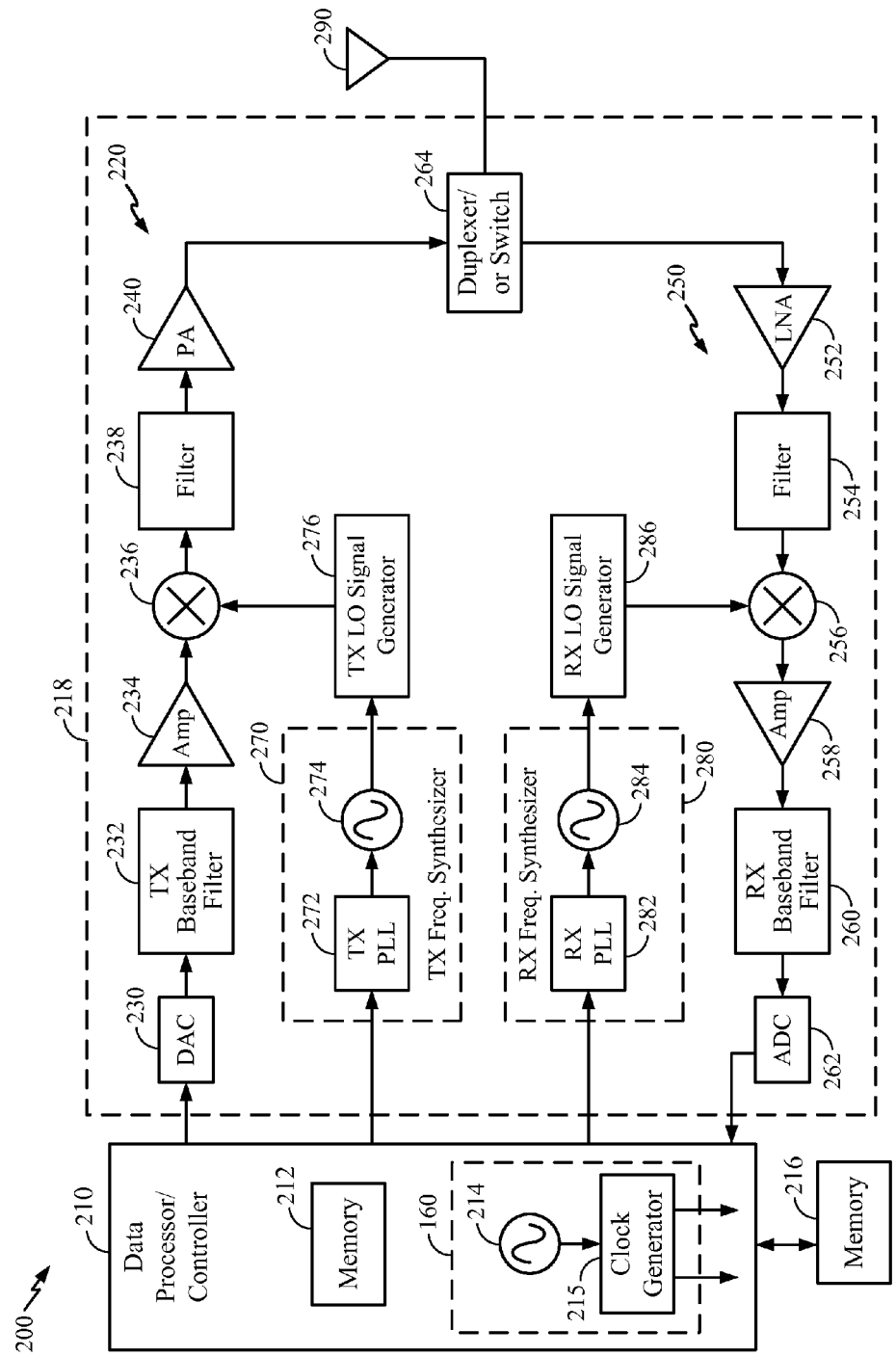
FIG. 2 is a block diagram of a wireless device.

FIG. 2 is a block diagram 200 of an exemplary wireless device, such as the wireless device 110. The wireless device includes a data processor/controller 210, a transceiver 218, and an antenna 290. The data processor/controller 210 may be referred to as a processing system. A processing system may include the data processor/controller 210 or both the data processor/controller 210 and the memory 216. The transceiver 218 includes a transmitter 220 and a receiver 250 that support bi-directional communication. The transmitter 220 and/or the receiver 250 may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier (amp) 234 may amplify the signal from the TX baseband filter 232 and provide an amplified baseband signal. An upconverter (mixer) 236 may receive the amplified baseband signal and a TX LO signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switchplexer 264.

For FDD, the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For TDD, the transmitter 220 and the receiver 250 may be coupled to switchplexer 264. The switchplexer 264 may pass the output RF signal from the transmitter 220 to the antenna 290 during uplink time intervals. For both FDD and TDD, the duplexer/switchplexer 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switchplexer 264. For FDD, the RX filter within the duplexer 264 may filter the received RF signal to pass signal components in a receive band and attenuate signal components in the transmit band. For TDD, the switchplexer 264 may pass the received RF signal from the antenna 290 to the receiver 250 during downlink time intervals. For both FDD and TDD, the duplexer/switchplexer 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator 276 may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 220 and the receiver 250. For example, impedance matching circuits may be located at the output of the PA 240, at the input of the LNA 252, between the antenna 290 and the duplexer/switchplexer 264, etc. Some circuits in FIG. 2 may also be omitted. For example, the filter 238 and/or the filter 254 may be omitted. All or a portion of the transceiver 218 may be implemented on one or more analog integrated circuits (ICs), RF ICs (RFICs), mixed-signal ICs, etc. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RFIC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 and/or the memory 216 may store program codes and data for the data processor/controller 210. The memory may be internal to the data processor/controller 210 (e.g., the memory 212) or external to the data processor/controller 210 (e.g., the memory 216). The memory may be referred to as a computer-readable medium. An oscillator 214 may generate a VCO signal at a particular frequency. In an aspect, the oscillator 214 may be a single-ended VCO outputting a sinusoidal signal at a particular clock frequency. A clock generator 215 may receive the VCO signal(s) from the oscillator 214 and may generate clock signals for various modules within the data processor/controller 210 and/or the transceiver 218. In an aspect, the oscillator 214 and the clock generator 215 are part of an exemplary reference clock quadrupler 160. The data processor/controller 210 may be implemented on one or more application specific integrated circuits (ASICs) and/or other ICs.

In an aspect, methods for improving phase noise (PN) performance of fractional-N RF synthesizers or any PLL (e.g., TX frequency synthesizer 270 or RX frequency synthesizer 280) involve increasing a reference clock signal frequency. For example, a reference clock frequency of a delay locked loop (DLL) or an integer-N PLL may be multiplied. However, doing so may suffer from large power consumption, large device area use, and/or mediocre PN performance. Accordingly, the present disclosure provides for an apparatus and method that quadruples a clock frequency of a signal from a sinusoidal signal source (e.g., crystal oscillator, single-ended VCO, etc.) while consuming less power, utilizing less device area, and improving PN performance.

In an aspect, the present disclosure provides for a circuit that quadruples a clock frequency by using a single-ended oscillator without requiring an integer-N PLL/DLL. The circuit utilizes two skewed buffers to generate two 25% duty cycle clock signals based on a sinusoidal signal outputted from a crystal oscillator. An exclusive-or operation (XOR) may be performed on the two 25% duty cycle clock signals generate a 2× clock signal. A frequency doubler may then be used to generate a 4× clock signal based on the 2× clock signal.

In an aspect, the two skewed buffers may be an NMOS skew buffer (NSB) and a PMOS skew buffer (PSB). The NMOS skew buffer may include an IO PMOS transistor and native NMOS transistors. The PMOS skew buffer may include a low voltage threshold (LVT) PMOS transistor and IO NMOS transistors.

The NMOS skew buffer is configured to generate a proper in-phase (I) clock signal having a 25% duty cycle while the PMOS skew buffer is configured to generate a proper quadrature-phase (Q) clock signal having a 25% duty cycle. The NMOS skew buffer includes two sections. A first section of the NMOS skew buffer may be enabled by a first enabling control signal output from a delay module to control a rising edge of the I clock signal. A second section of the NMOS skew buffer may be enabled by a second enabling control signal output from the delay module to control a falling edge of the I clock signal. To avoid any charge injection to the output of the NMOS skew buffer, the first enabling control signal and the second enabling control signal may be input to a last stage of the NMOS skew buffer.

In an aspect, the circuit may include a feedback module including three separate duty cycle correction (DCC) modules outputting three separate analog control voltages. Two DCC modules outputting two separate analog control voltages may control/skew voltage thresholds of the NMOS skew buffer in order to control the rising edge and falling edge of the I clock signal. For example, a first DCC module may be used to control the rising edge of the I clock signal to have a 25% duty cycle and a second DCC module may be used to control the falling edge of the I clock signal to have a 25% duty cycle. A third DCC module outputting an analog control voltage may control/skew a voltage threshold of the PMOS skew buffer in order to control the rising edge of the Q clock signal to have a 25% duty cycle.

Figure 3:
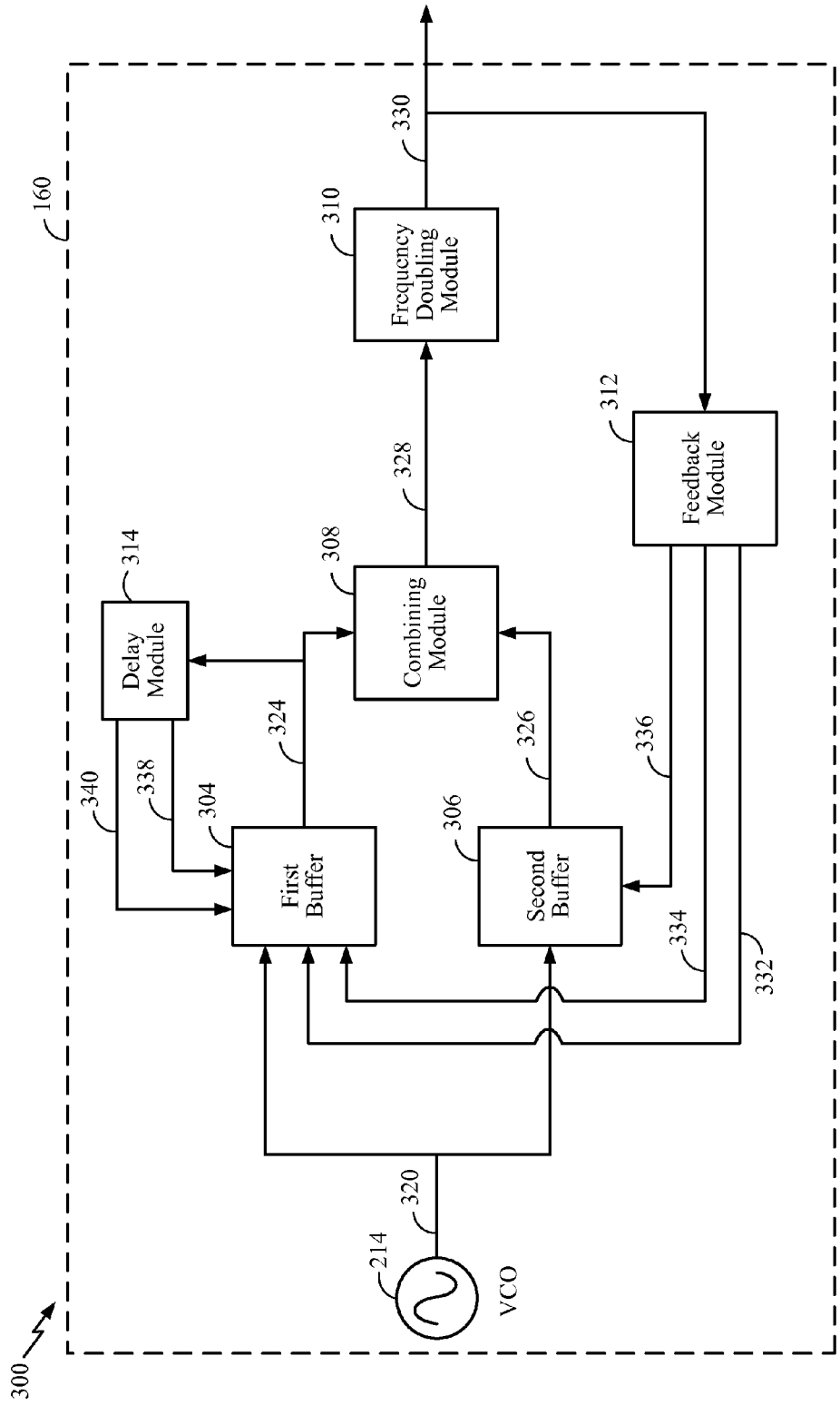
FIG. 3 is a block diagram illustrating a reference clock quadrupler.

FIG. 3 is a block diagram 300 illustrating a reference clock quadrupler 160. The reference clock quadrupler 160 may include a first buffer 304, a second buffer 306, a combining module 308, a frequency doubling module 310, a feedback module 312, and a delay module 314. The reference clock quadrupler 160 may further include an oscillator, such as a voltage-controlled oscillator 214.

Referring to FIG. 3, an oscillator (e.g., single-ended voltage-controlled oscillator (VCO)) 214 outputs a sinusoidal signal 320 to the first buffer 304 and the second buffer 306. The sinusoidal signal 320 may be outputted according to a first clock frequency (e.g., reference clock frequency).

The first buffer 304 receives the sinusoidal signal 320 and generates a first digital signal having a 25% duty cycle based on the sinusoidal signal 320. The first buffer 304 then outputs the first digital signal 324 having the 25% duty cycle to the combining module 308. The second buffer 306 receives the sinusoidal signal 320 and generates a second digital signal having a 25% duty cycle based on the sinusoidal signal 320. The second buffer 306 then outputs the second digital signal 326 having the 25% duty cycle to the combining module 308. In an aspect, the first buffer 304 and the second buffer 306 are inverters whose voltage thresholds are skewed in order to generate the digital signals having the 25% duty cycle. In a further aspect, the first buffer 304 may be an NMOS dual edge skew buffer and the second buffer 306 may be a PMOS skew buffer.

In an aspect, the first buffer 304 includes a first section and a second section. Accordingly, an active state of the first section and the second section may be controlled by the delay module 314. For example, the delay module 314 may receive the first digital signal 324 and determine a first delay based on the first digital signal 324. The delay module 314 may then control the active state of the first section by sending a first enabling control signal 338 to the first section based on the first delay. In another example, the delay module 314 may determine a second delay based on the first digital signal 324. Thereafter, the delay module 314 may control the active state of the second section by sending a second enabling control signal 340 to the second section based on the second delay.

The combining module 308 receives the first digital signal 324 and the second digital signal 326 and combines the signals to generate a combined digital signal having a 50% duty cycle and a second clock frequency that is twice the first clock frequency (2× clock). The combining module 308 then outputs the combined digital signal 328 to the frequency doubling module 310. In an aspect, the combining module 308 generates the combined digital signal to have four clean edges (e.g., rising and/or falling edges with high integrity) during one cycle with minimal phase noise degradation. The four clean edges may then be inputted to the frequency doubling module 310.

In an aspect, the combining module 308 may be implemented as an exclusive-or (XOR) gate that combines the first digital signal 324 and the second digital signal 326 to generate the combined digital signal 328 according to the following operation. The combining module 308 receives the first digital signal 324 from the first buffer 304 as a first input. The combining module 308 then receives the second digital signal 326 from the second buffer 306 as a second input. Thereafter, the combining module 308 may perform an exclusive-or operation using the first input and the second input, and output a result of the exclusive-or operation as the combined digital signal 328. Although an XOR gate is described with respect to the combining module 308, the present disclosure is not limited thereto. For example, the combining module 308 may also be implemented as an OR gate in place of the XOR gate.

The frequency doubling module 310 receives the combined digital signal 328 (e.g., four clean edges) and doubles the second clock frequency of the combined digital signal 328 to generate an output signal having a third clock frequency that is quadruple the first clock frequency (4× clock). The frequency doubling module 310 may then output the output signal 330 to various modules of the transceiver 218, such as the TX frequency synthesizer 270 (via the TX PLL 272) and/or the RX frequency synthesizer 280 (via the RX PLL 282).

In an aspect, the frequency doubling module 310 may be implemented as a doubler that doubles the second clock frequency of the combined digital signal 328 to generate the output signal 330 according to the following operation. First, the frequency doubling module 310 receives the combined digital signal 328 from the combining module 308. Thereafter, the frequency doubling module 310 performs an exclusive-or operation (e.g., via an XOR gate) using the combined digital signal 328 as a first input and a delayed version of the combined digital signal 328 as a second input. The frequency doubling module 310 then outputs a result of the exclusive-or operation as the output signal 330.

The feedback module 312 receives the output signal 330. Based on the output signal 330, the feedback module 312 generates a first control voltage 332 and a second control voltage 334 for driving the first buffer 304. The feedback module 312 also generates a third control voltage 336 based on the output signal 330 for driving the second buffer 306. The feedback module 312 outputs the first control voltage 332 and the second control voltage 334 to the first buffer 304, and outputs the third control voltage 336 to the second buffer 306. In an aspect, the first control voltage 332 controls/skews a first voltage threshold of the first buffer 304 facilitating the first buffer 304 to control a rising edge of the first digital signal 324. In a further aspect, the second control voltage 334 control/skews a second voltage threshold of the first buffer 304 facilitating the first buffer 304 to control a falling edge of the first digital signal 324. In another aspect, the third control voltage 336 controls/skews a voltage threshold of the second buffer 306 facilitating the second buffer 306 to control a rising edge of the second digital signal 326.

The first control voltage 332 and the second control voltage 334 provided to the first buffer 304, and the third control voltage 336 provided to the second buffer 306, ensures the ability of the combining module 308 to output a 50% duty cycle signal 328. That is, the control voltages provided by the feedback module 312 ensures the ability of the combining module 308 to generate a digital signal with four clean edges during one cycle. Correspondingly, the 50% duty cycle signal 328 (digital signal with four clean edges) ensures the ability of the frequency doubling module 310 to output a spur-free output signal 330 having the 4× clock. The spur-free output signal 330 having the 4× clock improves PN performance when inputted to the TX frequency synthesizer 270 (via the TX PLL 272) and/or the RX frequency synthesizer 280 (via the RX PLL 282).

Figure 4:
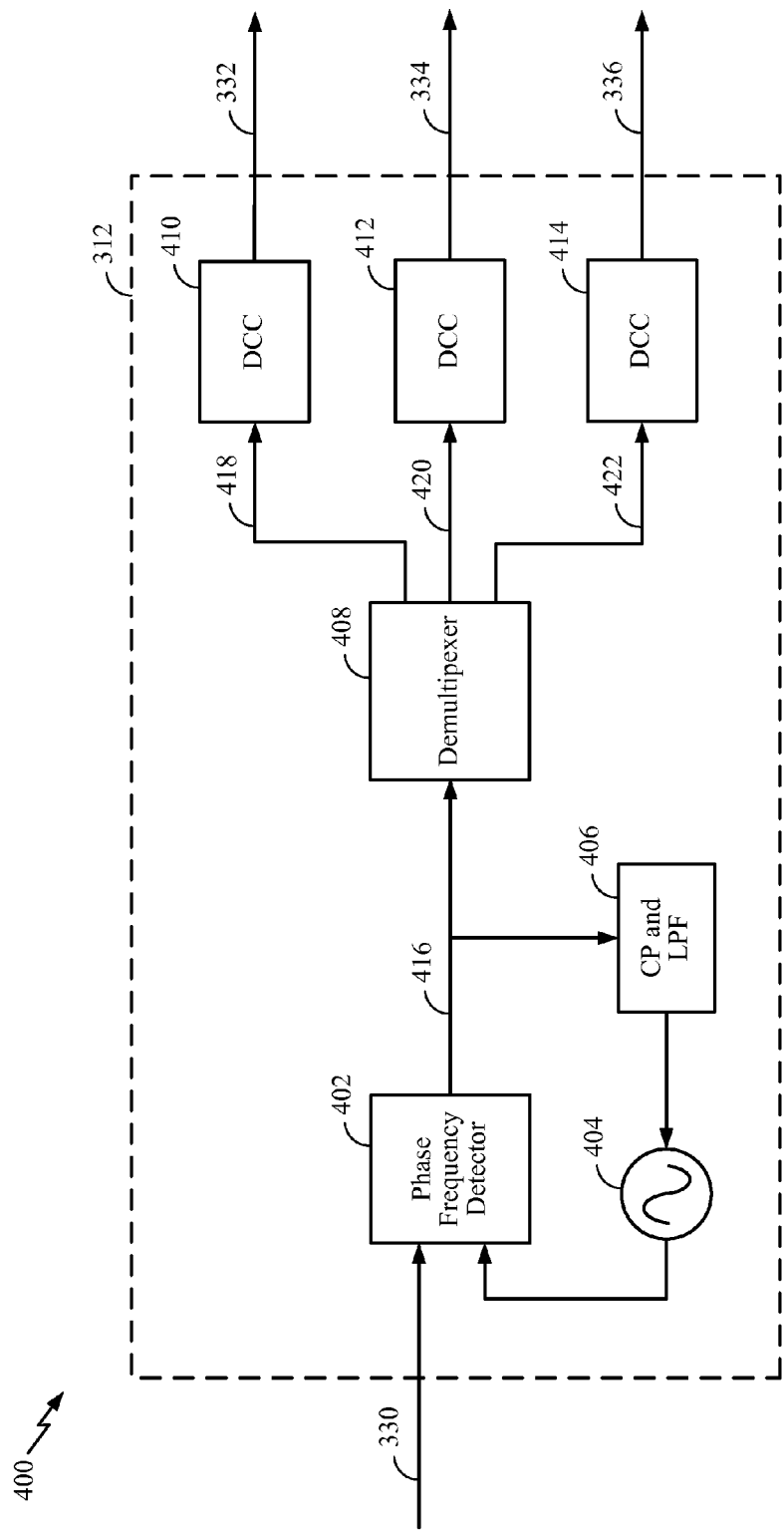
FIG. 4 is diagram illustrating a feedback module of FIG. 3.

FIG. 4 is diagram 400 illustrating the feedback module 312 of FIG. 3. Referring to FIGS. 3 and 4, the feedback module 312 may include a phase frequency detector 402, a demultiplexer 408, a first duty cycle correction (DCC) module 410, a second DCC module 412, and a third DCC module 336.

The phase frequency detector 402 receives the output signal 330 from the frequency doubling module 310 and generates an up/down signal based on edges of the output signal 330. In an aspect, the phase frequency detector 402 may be part of a phase locked loop (PLL) configured to generate a replica of the output signal 330 having the 4× clock and average out all edge variations of the output signal 330. The PLL may include charge pump and low pass filter (CP and LPF) 406 and oscillator 404. The up/down signal 416 may be output to the demultiplexer 408 and/or the CP and LPF 406.

The demultiplexer 408 separates receives the up/down signal 416 and separates pulses of the up/down signal 416 corresponding to the edges of the output signal 330. The demultiplexer 408 outputs a first separated pulse 418 to the first DCC module 410, a second separated pulse 420 to the second DCC module 412, and a third separated pulse 422 to the third DCC module 414. The first DCC module 410 generates and outputs the first control voltage 332 based on the first separated pulse 418. The second DCC module 412 generates and outputs the second control voltage 334 based on the second separated pulse 420. The third DCC module 414 generates and outputs the third control voltage 336 based on the third separated pulse 422.

In an aspect, any of the DCC modules 410, 412, or 414 described above may include an inverter, a first low pass filter (LPF), a second LPF, and an operational amplifier. The inverter may invert a separated pulse (e.g., first separated pulse 418, second separated pulse 420, or third separated pulse 422) to generate an inverse pulse. The first LPF generates an average of the inverse pulse. The second LPF generates an average of the separated pulse. The operational amplifier receives the average of the inverse pulse via a non-inverting input and the average of the separated pulse via an inverting input. The operational amplifier further determines a difference in voltage between the average of the inverse pulse and the average of the separated pulse, and amplifies the voltage difference to generate a control voltage (e.g., first control voltage 332, second control voltage 334, or third control voltage 336). Although the DCC module is described to include the specific elements mentioned above, a DCC module of the present disclosure is not limited thereto as any type of DCC feedback system capable of sensing a clock duty cycle may be used in accordance with the present disclosure.

Figure 5:
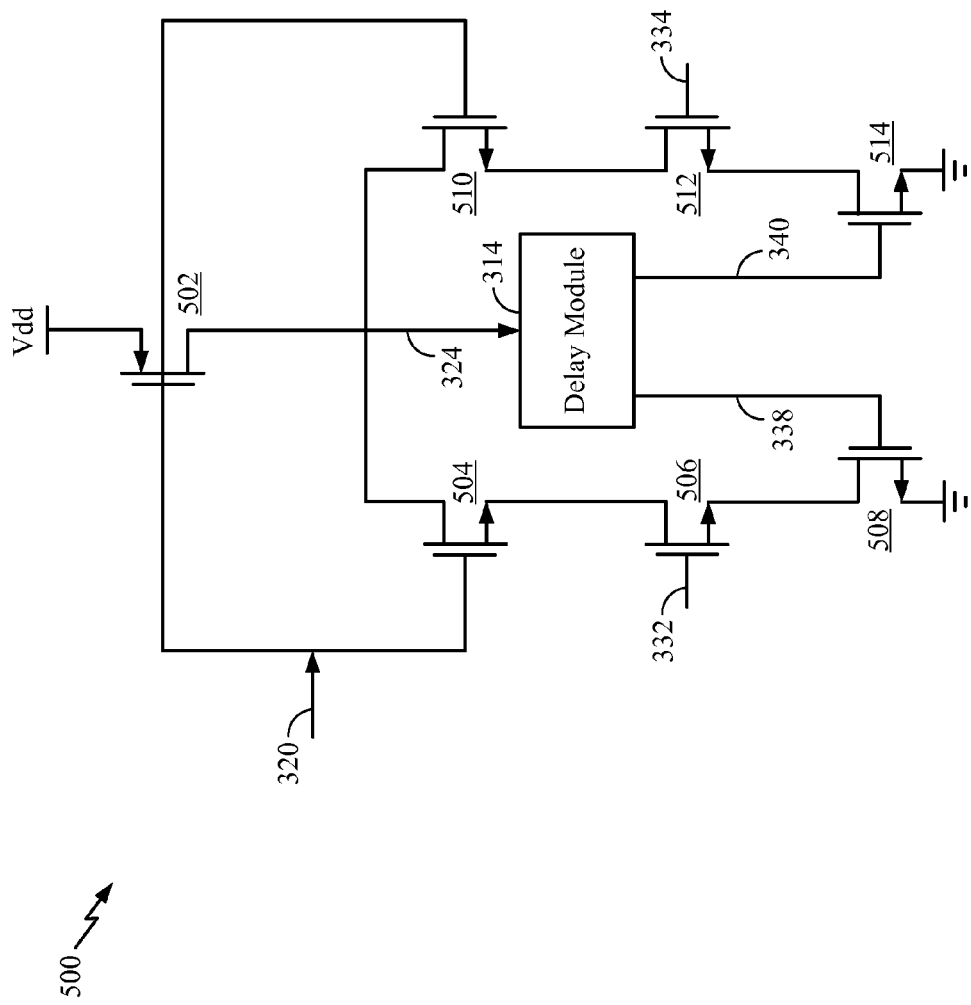
FIG. 5 is an example schematic circuit diagram illustrating a first buffer coupled to a delay module of FIG. 3.

FIG. 5 is an example schematic circuit diagram 500 illustrating the first buffer 304 coupled to the delay module 314 of FIG. 3. Referring to FIGS. 3 and 5, the first buffer 304 includes a first section for controlling a rising edge of the first digital signal 324 outputted from the first buffer 304 according to the first control voltage 332 received from the feedback module 312. The first buffer 304 also includes a second section for controlling a falling edge of the first digital signal 324 outputted from the first buffer 304 according to the second control voltage 334 received from the feedback module 312. The delay module 314 is operated to adjust a delay such that switching between the first section and the second section does not affect output of the first digital signal 324.

The first section of the first buffer 304 includes a first transistor 502, a second transistor 504, a third transistor 506, and a fourth transistor 508. A gate of the first transistor 502 is coupled to an output of the VCO 214 outputting the sinusoidal signal 320. A drain of the first transistor 502 is coupled to a drain of the second transistor 504, a first input of the combining module 308, and an input of a delay module 314. A source of the first transistor 502 is coupled to a voltage source Vdd.

A gate of the second transistor 504 is coupled to the output of the VCO 214 outputting the sinusoidal signal 320. The drain of the second transistor 504 is coupled to the drain of the first transistor 502. A source of the second transistor 504 is coupled to a drain of the third transistor 506.

A gate of the third transistor 506 is coupled to a first output of the feedback module 312 outputting the first control voltage 332. The drain of the third transistor 506 is coupled to the source of the second transistor 504. A source of the third transistor 506 is coupled to a drain of the fourth transistor 508.

A gate of the fourth transistor 508 is coupled to a first output 338 of the delay module 314. The drain of the fourth transistor 508 is coupled to the source of the third transistor 506. A source of the fourth transistor 508 is coupled to a ground node.

The second section of the first buffer 304 includes the first transistor 502, a fifth transistor 510, a sixth transistor 512, and a seventh transistor 514. The drain of the first transistor 502 is coupled to a drain of the fifth transistor 510.

A gate of the fifth transistor is coupled to the output of the VCO 214 outputting the sinusoidal signal 320. The drain of the fifth transistor 510 is coupled to the drain of the first transistor 502. A source of the fifth transistor 510 is coupled to a drain of the sixth transistor 512.

A gate of the sixth transistor 512 is coupled to a second output of the feedback module 312 outputting the second control voltage 334. The drain of the sixth transistor 512 is coupled to the source of the fifth transistor 510. A source of the sixth transistor 512 is coupled to a drain of the seventh transistor 514.

A gate of the seventh transistor 514 is coupled to a second output 340 of the delay module 314. The drain of the seventh transistor 514 is coupled to the source of the sixth transistor 512. A source of the seventh transistor 514 is coupled to a ground node.

In an aspect, the delay module 314 may control an active state of the first section. For example, the delay module 314 may receive the first digital signal 324 outputted by the first buffer 304 and determine a first delay based on the received first digital signal 324. Thereafter, the delay module 314 may activate the first section by sending a first enabling control signal 338 to the gate of the fourth transistor 508 based on the first delay.

In another aspect, the delay module 314 may control an active state of the second section of the first buffer 304. For example, the delay module 314 may determine a second delay based on the received first digital signal 324, and thereafter, activate the second section by sending a second enabling control signal 340 to the gate of the seventh transistor 514 based on the second delay.

Figure 6:
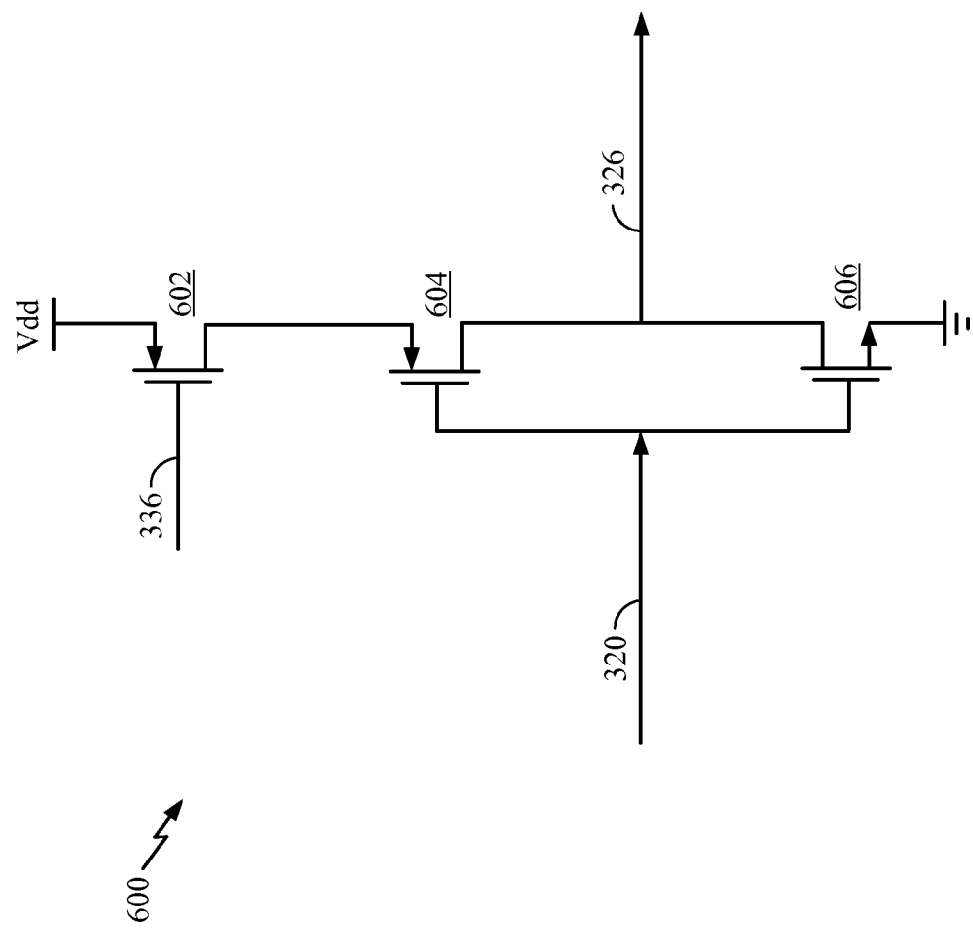
FIG. 6 is an example schematic circuit diagram illustrating a second buffer of FIG. 3.

FIG. 6 is an example schematic circuit diagram 600 illustrating the second buffer 306 of FIG. 3. Referring to FIGS. 3 and 6, the second buffer 306 controls a rising edge of the outputted second digital signal 326 according to the third control voltage 336 received from the feedback module 312. The second buffer 306 includes an eighth transistor 602, a ninth transistor 604, and a tenth transistor 606.

A gate of the eighth transistor 602 is coupled to a third output of the feedback module 312 outputting the third control voltage 336. A drain of the eighth transistor 602 is coupled to a source of the ninth transistor 604. A source of the eighth transistor 602 is coupled to a voltage source Vdd.

A gate of the ninth transistor 604 is coupled to the output of the VCO 214 outputting the sinusoidal signal 320. The source of the ninth transistor 604 is coupled to the drain of the eighth transistor 602. A drain of the ninth transistor 604 is coupled to a drain of the tenth transistor 606 and a second input of the combining module 308.

A gate of the tenth transistor 606 is coupled to the output of the VCO 214 outputting the sinusoidal signal 320. The drain of the tenth transistor 606 is coupled to the drain of the ninth transistor 604. A source of the tenth transistor 606 is coupled to a ground node.

Figure 7:
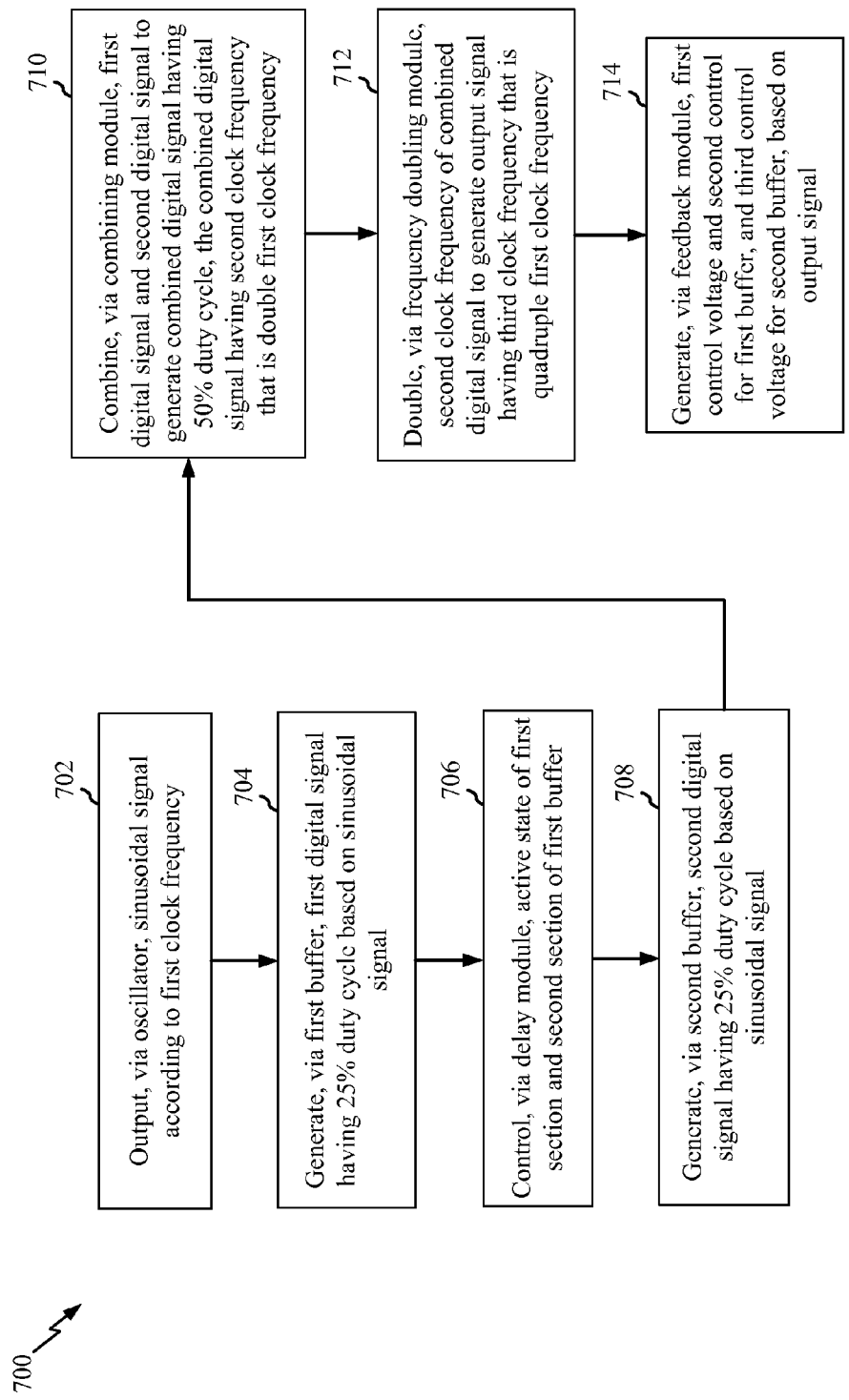
FIG. 7 is a flow chart of a method of quadrupling a clock frequency.

FIG. 7 is a flow chart 700 of a method of quadrupling a clock frequency. The method may be performed by an apparatus (e.g., reference clock quadrupler 160), via one or more of the oscillator 214, the first buffer 304, the second buffer 306, the combining module 308, the frequency doubling module 310, the feedback module 312, or the delay module 314.

At block 702, the apparatus outputs, via the oscillator 214, a sinusoidal signal according to a first clock frequency. At block 704, the apparatus generates, via the first buffer 304, a first digital signal having a 25% duty cycle based on the sinusoidal signal.

At block 706, the apparatus controls, via the delay module 314, an active state of a first section and a second section of the first buffer 304. At block 708, the apparatus generates, via the second buffer 306, a second digital signal having a 25% duty cycle based on the sinusoidal signal.

At block 710, the apparatus combines, via the combining module 308 combining, the first digital signal and the second digital signal to generate a combined digital signal having a 50% duty cycle. The combined digital signal has a second clock frequency that is double the first clock frequency. In an aspect, the combing module 308 generates the combined digital signal by receiving the first digital signal from the first buffer 304 as a first input, receiving the second digital signal from the second buffer 306 as a second input, performing an exclusive-or operation using the first input and the second input, and outputting a result of the exclusive-or operation as the combined digital signal.

At block 712, the apparatus doubles, via the frequency doubling module 310, the second clock frequency of the combined digital signal to generate an output signal having a third clock frequency that is quadruple the first clock frequency. In an aspect, the frequency doubling module 310 generates the output signal by receiving the combined digital signal from the combining module 308, performing an exclusive-or operation using the combined digital signal as a first input and a delayed version of the combined digital signal as a second input, and outputting a result of the exclusive-or operation as the output signal.

At block 714, the apparatus generates, via the feedback module 312, a first control voltage and a second control voltage for the first buffer 304 and a third control voltage for the second buffer 306 based on the output signal. The first control voltage controls a first threshold of the first buffer 304 facilitating the first buffer 304 to control a rising edge of the first digital signal. The second control voltage controls a second threshold of the first buffer 304 facilitating the first buffer 304 to control a falling edge of the first digital signal. The third control voltage controls a threshold of the second buffer 306 facilitating the second buffer 306 to control a rising edge of the second digital signal.

In an aspect, the apparatus generates the first control voltage, the second control voltage, and the third control voltage according to the following operation. The apparatus generates, via a phase frequency detector (PFD), an up/down pulse signal based on edges of the output signal. The apparatus then separates, via a demultiplexer, pulses of the up/down pulse signal respectively corresponding to the edges of the output signal. Thereafter, the apparatus generates the first control voltage based on a first separated pulse via a first duty cycle correction (DCC) module, the second control voltage based on a second separated pulse via a second DCC module, and the third control voltage based on a third separated pulse via a third DCC module.

In an aspect, the first buffer 304 comprises a first section and a second section. The first section includes a first transistor, a second transistor, a third transistor, and a fourth transistor. A source of the first transistor is coupled to a voltage source. A gate of the first transistor is coupled to an output of the oscillator 214 outputting the sinusoidal signal. A drain of the first transistor is coupled to a drain of the second transistor, a first input of the combining module 308, and an input of the delay module 314. A gate of the second transistor is coupled to the output of the oscillator 214 outputting the sinusoidal signal. The drain of the second transistor is coupled to the drain of the first transistor. A source of the second transistor is coupled to a drain of the third transistor. A gate of the third transistor is coupled to a first output of the feedback module 312 outputting the first control voltage. The drain of the third transistor is coupled to the source of the second transistor. A source of the third transistor is coupled to a drain of the fourth transistor. A gate of the fourth transistor is coupled to a first output of the delay module 314. The drain of the fourth transistor is coupled to the source of the third transistor. A source of the fourth transistor is coupled to a ground node.

The second section includes the first transistor, a fifth transistor, a sixth transistor, and a seventh transistor. The drain of the first transistor is coupled to a drain of the fifth transistor. A gate of the fifth transistor is coupled to the output of the oscillator 214 outputting the sinusoidal signal. The drain of the fifth transistor is coupled to the drain of the first transistor. A source of the fifth transistor is coupled to a drain of the sixth transistor. A gate of the sixth transistor is coupled to a second output of the feedback module 312 outputting the second control voltage. The drain of the sixth transistor is coupled to the source of the fifth transistor. A source of the sixth transistor is coupled to a drain of the seventh transistor. A gate of the seventh transistor is coupled to a second output of the delay module 314. The drain of the seventh transistor is coupled to the source of the sixth transistor. A source of the seventh transistor is coupled to a ground node.

In an aspect, the delay module 314 controls the active state of the first section of the first buffer 304 by receiving the first digital signal outputted from the first buffer 304, determining a first delay based on the received first digital signal, and activating the first section by sending a first enabling control signal to the gate of the fourth transistor based on the first delay. In a further aspect, the delay module 314 controls the active state of the second section of the first buffer 304 by determining a second delay based on the received first digital signal, and activating the second section by sending a second enabling control signal to the gate of the seventh transistor based on the second delay.

In an aspect, the second buffer 306 includes an eighth transistor, a ninth transistor, and a tenth transistor. A source of the eighth transistor is coupled to a voltage source. A gate of the eighth transistor is coupled to a third output of the feedback module 312 outputting the third control voltage. A drain of the eighth transistor is coupled to a source of the ninth transistor. A gate of the ninth transistor is coupled to the output of the oscillator 214 outputting the sinusoidal signal. The source of the ninth transistor is coupled to the drain of the eighth transistor. A drain of the ninth transistor is coupled to a drain of the tenth transistor and a second input of the combining module 308. A gate of the tenth transistor is coupled to the output of the oscillator 214 outputting the sinusoidal signal. The drain of the tenth transistor is coupled to the drain of the ninth transistor. A source of the tenth transistor is coupled to a ground node.

Referring again to FIG. 3, an apparatus (e.g., reference clock quadrupler 160) may include the oscillator 214, the first buffer 304, the second buffer 306, the combining module 308, the frequency doubling module 310, the feedback module 312, and the delay module 314. The apparatus includes means for outputting a sinusoidal signal according to a first clock frequency. The apparatus also includes means for generating a first digital signal having a 25% duty cycle based on the sinusoidal signal. The apparatus further includes means for generating a second digital signal having a 25% duty cycle based on the sinusoidal signal. The apparatus includes means for combining the first digital signal and the second digital signal to generate a combined digital signal having a 50% duty cycle, the combined digital signal having a second clock frequency that is double the first clock frequency. The apparatus further includes means for doubling the second clock frequency of the combined digital signal to generate an output signal having a third clock frequency that is quadruple the first clock frequency. The apparatus also includes means for providing feedback configured to generate a first control voltage and a second control voltage for the first buffer and a third control voltage for the second buffer based on the output signal. The apparatus includes means for delaying configured to control an active state of a first section and a second section of the first buffer. The aforementioned means may be one or more of the oscillator 214, the first buffer 304, the second buffer 306, the combining module 308, the frequency doubling module 310, the feedback module 312, the delay module 314, the data processor/controller 210, the computer-readable medium, i.e., the memory 212, and/or the computer-readable medium, i.e., the memory 216 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus for quadrupling a clock frequency, comprising:
    a voltage-controlled oscillator (VCO) configured to output a sinusoidal signal according to a first clock frequency;
    a first buffer configured to generate, based on the sinusoidal signal, a first digital signal having a 25% duty cycle;
    a second buffer configured to generate, based on the sinusoidal signal, a second digital signal having a 25% duty cycle;
    a combining module configured to combine the first digital signal and the second digital signal to generate a combined digital signal having a 50% duty cycle, the combined digital signal having a second clock frequency that is double the first clock frequency;
    a frequency doubling module configured to double the second clock frequency of the combined digital signal to generate an output signal having a third clock frequency that is quadruple the first clock frequency; and
    a feedback module configured to couple to the output signal to generate a feedback output, wherein at least one of the first buffer and the second buffer operates based on the feedback output.

2. The apparatus of claim 1,
    wherein the feedback module is configured to generate, based on the output signal, the feedback output comprising a first control voltage and a second control voltage for the first buffer and a third control voltage for the second buffer,
    wherein the first control voltage controls a first threshold of the first buffer facilitating the first buffer to control a rising edge of the first digital signal,
    wherein the second control voltage controls a second threshold of the first buffer facilitating the first buffer to control a falling edge of the first digital signal, and
    wherein the third control voltage controls a threshold of the second buffer facilitating the second buffer to control a rising edge of the second digital signal.

3. The apparatus of claim 2, wherein the feedback module comprises:
    a phase frequency detector (PFD) configured to generate an up/down pulse signal based on edges of the output signal;
    a demultiplexer configured to separate pulses of the up/down pulse signal respectively corresponding to the edges of the output signal;
    a first duty cycle correction (DCC) module configured to generate the first control voltage based on a first separated pulse;
    a second DCC module configured to generate the second control voltage based on a second separated pulse; and
    a third DCC module configured to generate the third control voltage based on a third separated pulse.

4. The apparatus of claim 2, wherein the first buffer comprises a first section and a second section,
    wherein the first section comprises a first transistor, a second transistor, a third transistor, and a fourth transistor,
    wherein a gate of the first transistor is coupled to an output of the VCO outputting the sinusoidal signal, and a drain of the first transistor is coupled to a drain of the second transistor, a first input of the combining module, and an input of a delay module,
    wherein a gate of the second transistor is coupled to the output of the VCO outputting the sinusoidal signal, the drain of the second transistor is coupled to the drain of the first transistor, and a source of the second transistor is coupled to a drain of the third transistor,
    wherein a gate of the third transistor is coupled to a first output of the feedback module outputting the first control voltage, the drain of the third transistor is coupled to the source of the second transistor, and a source of the third transistor is coupled to a drain of the fourth transistor, and
    wherein a gate of the fourth transistor is coupled to a first output of the delay module, and the drain of the fourth transistor is coupled to the source of the third transistor.

5. The apparatus of claim 4,
    wherein the second section comprises the first transistor, a fifth transistor, a sixth transistor, and a seventh transistor,
    wherein the drain of the first transistor is coupled to a drain of the fifth transistor,
    wherein a gate of the fifth transistor is coupled to the output of the VCO outputting the sinusoidal signal, the drain of the fifth transistor is coupled to the drain of the first transistor, and a source of the fifth transistor is coupled to a drain of the sixth transistor,
    wherein a gate of the sixth transistor is coupled to a second output of the feedback module outputting the second control voltage, the drain of the sixth transistor is coupled to the source of the fifth transistor, and a source of the sixth transistor is coupled to a drain of the seventh transistor, and
    wherein a gate of the seventh transistor is coupled to a second output of the delay module, and the drain of the seventh transistor is coupled to the source of the sixth transistor.

6. The apparatus of claim 5,
    wherein a source of the first transistor is coupled to a voltage source, and
    wherein a source of the fourth transistor and a source of the seventh transistor is coupled to a ground node.

7. The apparatus of claim 5, wherein the delay module is configured to control an active state of the first section and the second section by:
    receiving the first digital signal outputted from the first buffer;
    determining a first delay based on the received first digital signal;

activating the first section by sending a first enabling control signal to the gate of the fourth transistor based on the first delay;

determining a second delay based on the received first digital signal; and activating the second section by sending a second enabling control signal to the gate of the seventh transistor based on the second delay.

8. The apparatus of claim 5, wherein the second buffer comprises an eighth transistor, a ninth transistor, and a tenth transistor, wherein a gate of the eighth transistor is coupled to a third output of the feedback module outputting the third control voltage, and a drain of the eighth transistor is coupled to a source of the ninth transistor, wherein a gate of the ninth transistor is coupled to the output of the VCO outputting the sinusoidal signal, the source of the ninth transistor is coupled to the drain of the eighth transistor, and a drain of the ninth transistor is coupled to a drain of the tenth transistor and a second input of the combining module, and wherein a gate of the tenth transistor is coupled to the output of the VCO outputting the sinusoidal signal, and the drain of the tenth transistor is coupled to the drain of the ninth transistor.

9. The apparatus of claim 8, wherein a source of the eighth transistor is coupled to a voltage source, and wherein a source of the tenth transistor is coupled to a ground node.

10. The apparatus of claim 1, wherein the combining module is configured to combine the first digital signal and the second digital signal to generate the combined digital signal by:

receiving the first digital signal from the first buffer as a first input;

receiving the second digital signal from the second buffer as a second input;

performing an exclusive-or operation using the first input and the second input; and outputting a result of the exclusive-or operation as the combined digital signal.

11. The apparatus of claim 1, wherein the frequency doubling module is configured to double the second clock frequency of the combined digital signal to generate the output signal by:

receiving the combined digital signal from the combining module;

performing an exclusive-or operation using the combined digital signal as a first input and a delayed version of the combined digital signal as a second input; and outputting a result of the exclusive-or operation as the output signal.

12. A method of quadrupling a clock frequency, comprising:

outputting, via a voltage-controlled oscillator (VCO), a sinusoidal signal according to a first clock frequency;

generating, via a first buffer, a first digital signal having a 25% duty cycle based on the sinusoidal signal;

generating, via a second buffer, a second digital signal having a 25% duty cycle based on the sinusoidal signal;

combining, via a combining module, the first digital signal and the second digital signal to generate a combined digital signal having a 50% duty cycle, the combined digital signal having a second clock frequency that is double the first clock frequency;

doubling, via a frequency doubling module, the second clock frequency of the combined digital signal to generate an output signal having a third clock frequency that is quadruple the first clock frequency; and generating a feedback output via a feedback module, wherein the feedback module is coupled to the output signal, and at least one of the generating the first digital signal and the generating the second digital signal is based on the feedback output.

13. The method of claim 12, further comprising:

generating, via the feedback module, the feedback output comprising a first control voltage and a second control voltage for the first buffer and a third control voltage for the second buffer based on the output signal, wherein the first control voltage controls a first threshold of the first buffer facilitating the first buffer to control a rising edge of the first digital signal, wherein the second control voltage controls a second threshold of the first buffer facilitating the first buffer to control a falling edge of the first digital signal, and wherein the third control voltage controls a threshold of the second buffer facilitating the second buffer to control a rising edge of the second digital signal.

14. The method of claim 13, wherein the generating the first control voltage, the second control voltage, and the third control voltage comprises:

generating, via a phase frequency detector (PFD), an up/down pulse signal based on edges of the output signal;

separating, via a demultiplexer, pulses of the up/down pulse signal respectively corresponding to the edges of the output signal;

generating, via a first duty cycle correction (DCC) module, the first control voltage based on a first separated pulse;

generating, via a second DCC module, the second control voltage based on a second separated pulse; and generating, via a third DCC module, the third control voltage based on a third separated pulse.

15. The method of claim 13, wherein the first buffer comprises a first section and a second section, wherein the first section comprises a first transistor, a second transistor, a third transistor, and a fourth transistor, wherein a gate of the first transistor is coupled to an output of the VCO outputting the sinusoidal signal, and a drain of the first transistor is coupled to a drain of the second transistor, a first input of the combining module, and an input of a delay module, wherein a gate of the second transistor is coupled to the output of the VCO outputting the sinusoidal signal, the drain of the second transistor is coupled to the drain of the first transistor, and a source of the second transistor is coupled to a drain of the third transistor, wherein a gate of the third transistor is coupled to a first output of the feedback module outputting the first control voltage, the drain of the third transistor is coupled to the source of the second transistor, and a source of the third transistor is coupled to a drain of the fourth transistor, and wherein a gate of the fourth transistor is coupled to a first output of the delay module, and the drain of the fourth transistor is coupled to the source of the third transistor.

16. The method of claim 15, wherein the second section comprises the first transistor, a fifth transistor, a sixth transistor, and a seventh transistor, wherein the drain of the first transistor is coupled to a drain of the fifth transistor, wherein a gate of the fifth transistor is coupled to the output of the VCO outputting the sinusoidal signal, the drain of the fifth transistor is coupled to the drain of the first transistor, and a source of the fifth transistor is coupled to a drain of the sixth transistor, wherein a gate of the sixth transistor is coupled to a second output of the feedback module outputting the second control voltage, the drain of the sixth transistor is coupled to the source of the fifth transistor, and a source of the sixth transistor is coupled to a drain of the seventh transistor, and wherein a gate of the seventh transistor is coupled to a second output of the delay module, and the drain of the seventh transistor is coupled to the source of the sixth transistor.

17. The method of claim 16, wherein a source of the first transistor is coupled to a voltage source, and wherein a source of the fourth transistor and a source of the seventh transistor is coupled to a ground node.

18. The method of claim 16, further comprising controlling, via the delay module, an active state of the first section and the second section, wherein the controlling comprises:

receiving the first digital signal outputted from the first buffer;

determining a first delay based on the received first digital signal;

activating the first section by sending a first enabling control signal to the gate of the fourth transistor based on the first delay;

determining a second delay based on the received first digital signal; and activating the second section by sending a second enabling control signal to the gate of the seventh transistor based on the second delay.

19. The method of claim 16, wherein the second buffer comprises an eighth transistor, a ninth transistor, and a tenth transistor, wherein a gate of the eighth transistor is coupled to a third output of the feedback module outputting the third control voltage, and a drain of the eighth transistor is coupled to a source of the ninth transistor, wherein a gate of the ninth transistor is coupled to the output of the VCO outputting the sinusoidal signal, the source of the ninth transistor is coupled to the drain of the eighth transistor, and a drain of the ninth transistor is coupled to a drain of the tenth transistor and a second input of the combining module, wherein a gate of the tenth transistor is coupled to the output of the VCO outputting the sinusoidal signal, and the drain of the tenth transistor is coupled to the drain of the ninth transistor, wherein a source of the eighth transistor is coupled to a voltage source, and wherein a source of the tenth transistor is coupled to a ground node.

20. The method of claim 12, wherein the combining the first digital signal and the second digital signal to generate the combined digital signal comprises:

receiving the first digital signal from the first buffer as a first input;

receiving the second digital signal from the second buffer as a second input;

performing an exclusive-or operation using the first input and the second input; and outputting a result of the exclusive-or operation as the combined digital signal.

21. The method of claim 12, wherein the doubling the second clock frequency of the combined digital signal to generate the output signal comprises:

receiving the combined digital signal from the combining module;

performing an exclusive-or operation using the combined digital signal as a first input and a delayed version of the combined digital signal as a second input; and outputting a result of the exclusive-or operation as the output signal.

22. An apparatus for quadrupling a clock frequency, comprising:

means for outputting a sinusoidal signal according to a first clock frequency;

means for generating a first digital signal having a 25% duty cycle based on the sinusoidal signal;

means for generating a second digital signal having a 25% duty cycle based on the sinusoidal signal;

means for combining the first digital signal and the second digital signal to generate a combined digital signal having a 50% duty cycle, the combined digital signal having a second clock frequency that is double the first clock frequency;

means for doubling the second clock frequency of the combined digital signal to generate an output signal having a third clock frequency that is quadruple the first clock frequency; and means for providing feedback coupled to the output signal and generates a feedback output, wherein at least one of the means for generating the first digital signal and the means for generating the second digital signal operates based on the feedback output.

23. The apparatus of claim 22, wherein the means for providing feedback is configured to generate the feedback output comprising a first control voltage and a second control voltage for the first buffer and a third control voltage for the second buffer based on the output signal, wherein the first control voltage controls a first threshold of the means for generating the first digital signal facilitating control of a rising edge of the first digital signal, wherein the second control voltage controls a second threshold of the means for generating the first digital signal facilitating control of a falling edge of the first digital signal, and wherein the third control voltage controls a threshold of the means for generating the second digital signal facilitating control of a rising edge of the second digital signal.

24. The apparatus of claim 23, wherein the means for providing feedback is configured to:

generate an up/down pulse signal based on edges of the output signal;

separate pulses of the up/down pulse signal respectively corresponding to the edges of the output signal;

generate the first control voltage based on a first separated pulse;

generate the second control voltage based on a second separated pulse; and generate the third control voltage based on a third separated pulse.

25. The apparatus of claim 23, wherein the means for generating the first digital signal comprises a first section and a second section, wherein the first section comprises a first transistor, a second transistor, a third transistor, and a fourth transistor, wherein a gate of the first transistor is coupled to an output of the means for outputting the sinusoidal signal, and a drain of the first transistor is coupled to a drain of the second transistor, a first input of the means for combining, and an input of a means for delaying, wherein a gate of the second transistor is coupled to the output of the means outputting the sinusoidal signal, the drain of the second transistor is coupled to the drain of the first transistor, and a source of the second transistor is coupled to a drain of the third transistor, wherein a gate of the third transistor is coupled to a first output of the means for providing feedback outputting the first control voltage, the drain of the third transistor is coupled to the source of the second transistor, and a source of the third transistor is coupled to a drain of the fourth transistor, and wherein a gate of the fourth transistor is coupled to a first output of the means for delaying, and the drain of the fourth transistor is coupled to the source of the third transistor.

26. The apparatus of claim 25, wherein the second section comprises the first transistor, a fifth transistor, a sixth transistor, and a seventh transistor, wherein the drain of the first transistor is coupled to a drain of the fifth transistor, wherein a gate of the fifth transistor is coupled to the output of the means for outputting the sinusoidal signal, the drain of the fifth transistor is coupled to the drain of the first transistor, and a source of the fifth transistor is coupled to a drain of the sixth transistor, wherein a gate of the sixth transistor is coupled to a second output of the means for providing feedback outputting the second control voltage, the drain of the sixth transistor is coupled to the source of the fifth transistor, and a source of the sixth transistor is coupled to a drain of the seventh transistor, wherein a gate of the seventh transistor is coupled to a second output of the means for delaying, and the drain of the seventh transistor is coupled to the source of the sixth transistor, wherein a source of the first transistor is coupled to a voltage source, and wherein a source of the fourth transistor and a source of the seventh transistor is coupled to a ground node.

27. The apparatus of claim 26, wherein the means for delaying is configured to control an active state of the first section and the second section by:

receiving the first digital signal outputted from the means for generating the first digital signal;

determining a first delay based on the received first digital signal;

activating the first section by sending a first enabling control signal to the gate of the fourth transistor based on the first delay;

determining a second delay based on the received first digital signal; and activating the second section by sending a second enabling control signal to the gate of the seventh transistor based on the second delay.

28. The apparatus of claim 26, wherein the means for generating the second digital signal comprises an eighth transistor, a ninth transistor, and a tenth transistor, wherein a gate of the eighth transistor is coupled to a third output of the means for providing feedback outputting the third control voltage, and a drain of the eighth transistor is coupled to a source of the ninth transistor, wherein a gate of the ninth transistor is coupled to the output of the means for outputting the sinusoidal signal, the source of the ninth transistor is coupled to the drain of the eighth transistor, and a drain of the ninth transistor is coupled to a drain of the tenth transistor and a second input of the means for combining, and wherein a gate of the tenth transistor is coupled to the output of the means for outputting the sinusoidal signal, and the drain of the tenth transistor is coupled to the drain of the ninth transistor, wherein a source of the eighth transistor is coupled to a voltage source, and wherein a source of the tenth transistor is coupled to a ground node.

29. The apparatus of claim 22, wherein the means for combining generates the combined digital signal by:

receiving the first digital signal from the means for generating the first digital signal as a first input;

receiving the second digital signal from the means for generating the second digital signal as a second input;

performing an exclusive-or operation using the first input and the second input; and outputting a result of the exclusive-or operation as the combined digital signal.

30. The apparatus of claim 22, wherein the means for doubling generates the output signal by:

receiving the combined digital signal from the means for combining;

performing an exclusive-or operation using the combined digital signal as a first input and a delayed version of the combined digital signal as a second input; and outputting a result of the exclusive-or operation as the output signal.

* * * * *